US008333295B1

(12) United States Patent
Parker et al.

(10) Patent No.: US 8,333,295 B1
(45) Date of Patent: Dec. 18, 2012

(54) PRESSURE VESSEL

(75) Inventors: Robert Parker, Panama City, FL (US);
David Robinson, Panama City, FL (US);
Anthony Simpson, Panama City, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 602 days.

(21) Appl. No.: 12/583,568

(22) Filed: Aug. 17, 2009

(51) Int. Cl.
*G12B 9/00* (2006.01)
(52) U.S. Cl. .......................................... 220/584; 114/312
(58) Field of Classification Search .................. 114/312,
114/321, 315, 322, 326; 220/584, 592.27
See application file for complete search history.

(56) References Cited

U.S. PATENT DOCUMENTS

| | | | | |
|---|---|---|---|---|
| 3,563,089 A * | 2/1971 | Henderson | .................. | 73/170.29 |
| 3,713,412 A * | 1/1973 | Ianuzzi | .......................... | 114/312 |
| 4,674,915 A * | 6/1987 | Shatto, Jr. | ...................... | 405/191 |
| 6,315,626 B2 * | 11/2001 | Jochmann et al. | ............... | 441/32 |
| 6,321,676 B1 * | 11/2001 | Kohnen et al. | ................. | 114/312 |
| 7,290,496 B2 * | 11/2007 | Asfar et al. | ..................... | 114/312 |
| 7,496,000 B2 * | 2/2009 | Vosburgh et al. | .............. | 367/134 |
| 2007/0125289 A1 * | 6/2007 | Asfar et al. | .................... | 114/312 |

* cited by examiner

*Primary Examiner* — Steven A. Reynolds
*Assistant Examiner* — King M Chu
(74) *Attorney, Agent, or Firm* — James T. Shepherd

(57) ABSTRACT

The invention in one variation is a pressure vessel having a pair of hemispheres with a wall and a circular edge, a pair of sealing elements, and an intervening mounting plate with circular groove on both sides of the plate. The hemispheres are mounted on opposite sides of the plate. Each groove has an sealing element and the circular edge. A seal is formed between the plate and a hemisphere when the hemisphere is pressed against the sealing element. Pressure can be generated by creating a partial vacuum in the sealed hemispheres or by using clamps. When exposed to higher pressures, such as when the vessel is used underwater, the pressure on the hemispheres is conveyed to the sealing element forming an even tighter seal. The vessel has interface connections that enable communication to and from devices mounted inside. The vessels are modular and can be ganged to provide redundancy or different functions.

3 Claims, 5 Drawing Sheets

PRESSURE VESSEL

STATEMENT OF GOVERNMENT INTEREST

The invention described-herein may be manufactured and used by or for the Government of the United States of America for Governmental purposes without the payment of any royalties thereon or therefore.

BACKGROUND OF THE INVENTION

1. Field of the Invention

The present invention relates generally to a pressure vessel, and in particular to an underwater pressure vessel that provides a substantially constant pressure environment in the vessel at sea level and in deep water, high external pressure conditions.

2. Prior Art

Underwater pressure vessels are used to maintain an internal environment that is dry and at a substantially constant internal pressure that is independent of potentially high external pressures, where the external pressures are a function of the vessel's depth in the water. Underwater pressure vessels are used for a variety of applications, such as providing a protective environment to house a source of power, a mechanical device, an electronic device and the like. Underwater pressure vessels typically have a cylindrical design, having a first end and second end. Their manufacture requires precision machining of both ends of a cylindrical body. The ends are fitted with end caps fabricated to close tolerances, sufficiently precise to seal the ends of the cylindrical vessel. Considerable machining setup time is required for fabrication of the cylinder and the two end caps, resulting in a significant portion of total product costs. Underwater pressure vessels can be outfitted to have sub-function capabilities of a system. Systems that have many elements require larger cylinders, and in circumstances where all the sub-function capabilities of the system are housed in the same pressure vessel, a considerable premium is paid to obtain a cylindrical stock piece that can house everything. Due to the cumbersome nature of larger stock pieces, there is a much higher probability of machining/fabrication errors, at a disproportionate rate based on the diameter of the stock piece.

SUMMARY OF THE INVENTION

The invention provides for a rapidly reconfigurable, reusable, modular pressure vessel that can withstand external pressure. An aspect of the invention is that the pressure vessel is suitable for use in above water applications and underwater applications, including saltwater, at depths where the external pressure can be high, and regardless of the external pressure, a substantially constant pressure is maintained inside the pressure vessel. In one variation, the pressure vessel also provides a non-metallic, non-corrosive, non-magnetic, non-galvanic environment. The modular pressure vessel can be used individually, ganged with other pressure vessels, and in combination with other devices.

BRIEF DESCRIPTION OF THE DRAWINGS

The foregoing invention will become readily apparent by referring to the following detailed description and the appended drawings in which.

DETAILED DESCRIPTION OF THE INVENTION

The invented pressure vessel is rapidly reconfigurable, and, as will become apparent, access to the interior is quick. There are relatively few elements involved, and the vessel can be quickly re-sealed. In one variation the pressure vessel also provides a non-metallic, non-corrosive, non-magnetic, non-galvanic environment, where some or all elements are at least partially composed of a polymeric material. Accessing the interior is not destructive, and the vessel is reusable. The elements of the pressure vessel can be selected to withstand relatively high external pressure.

The pressure vessel is suitable for use in above water applications and underwater applications, including saltwater, at depths where the external pressure can be high, and regardless of the external pressure, there is a substantially constant pressure maintained inside the pressure vessel.

Figure 1:
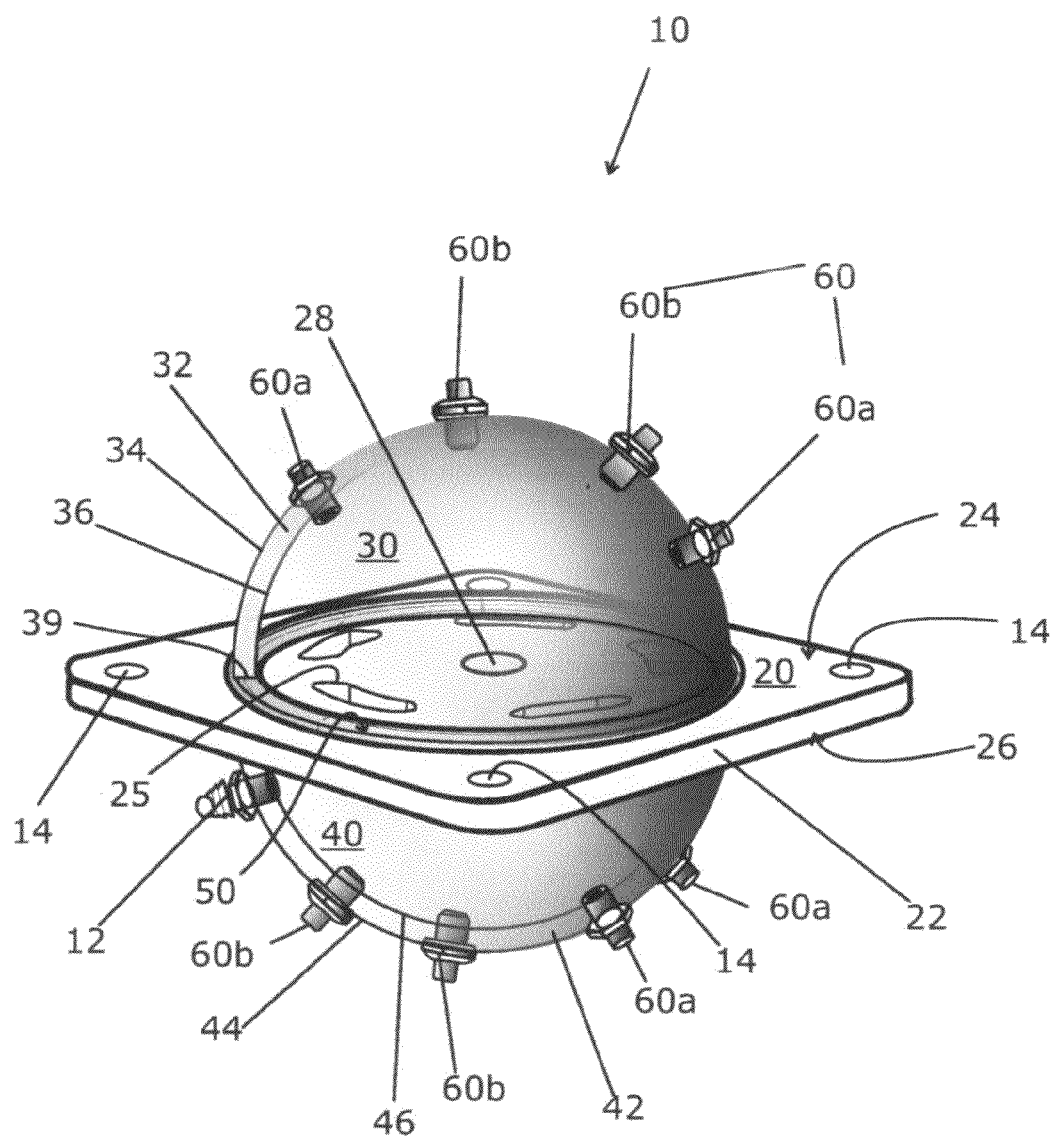
FIG. 1 is a perspective side view of a pressure vessel that has a pair of hemispheres with a wall and a circular edge, a pair of sealing elements, and an intervening mounting plate with a circular groove.
Figure 2:
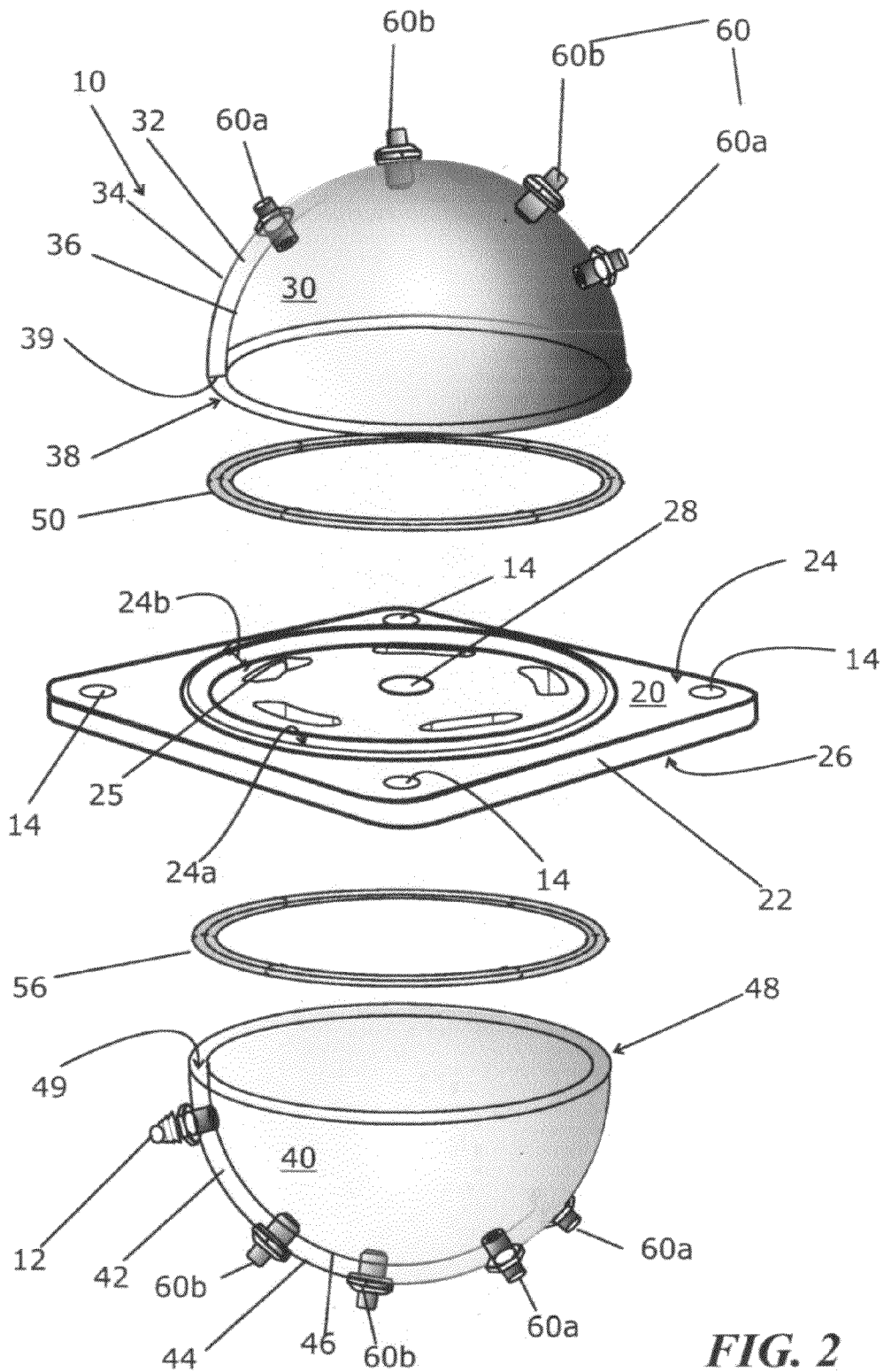
FIG. 2 is an exploded view of the pressure vessel illustrated in FIG. 1.

Referring to FIG. 1 and FIG. 2 the pressure vessel 10 has a first hemisphere 30 with a first wall 32 having a first outside diameter 34, a first inside diameter 36, and a first circular edge 38 with a first width 39. There is a first sealing element 50 and a second sealing element 56. The sealing elements in the illustrated embodiment are o-rings or gaskets which are elastic, composed of an elastic polymeric material that desirably has good weathering. In one embodiment the elastic polymeric material is a thermoplastic material. There is a second hemisphere 40 with a second wall 42 having a second outside diameter 44, a second inside diameter 46, and a second circular edge 48 with a second width 49. There is a mounting plate 20 with a thickness 22, where the plate has a first side 24 with a first circular groove 24a with a breadth 24b greater than the first width 39 of the first circular edge 38, and an opposing second side 26 with a second circular groove with a breadth greater than the second width 49 of the second circular edge 48. The first sealing element 50 is seated between the first circular groove 24a and the first circular edge 38 of the first hemisphere 30 forming a first seal. The first seal is formed where the first circular edge 38 of the first hemisphere 30 presses against the first sealing element 50. Similarly, the second sealing element 56 is seated between the second circular groove (not shown) of the opposing second side 26 of the plate 20 and the second circular edge 48. The second seal is formed where the second circular edge 48 of the second hemisphere 40 presses against the second sealing element 56. The greater the force of the hemispheres, the tighter the seal. The juxtaposition of a pair hemispheres 30,40 mounted opposing each other on the intervening plate 20 produces substantially equal and opposing forces against the plate. The grooves have a depth and breadth sufficient to accommodate the two sealing elements 50,56 and the first and second circular edges 38,48 of the respective hemispheres 30,40. The sealing element(s) is selected to have a resilience, Durometer and shape to provide a water and air tight seal. The sealing element, when an o-ring or a gasket, is composed of an elastomeric material that has good weathering properties.

A volume inside the first and second sealed hemispheres 30,40 defines an interior of the pressure vessel 10 having an inside pressure, and an exterior of the pressure vessel having an outside pressure. An increase in the outside pressure produces an increased pressure by the individual hemispheres on their respective sealing element, therein providing a tighter seal.

The hemispheres 30,40 in one embodiment are desirably transparent, therein allowing easy inspection of the interior, even underwater, where visibility is possible. Clear engineering plastics, such as polycarbonate, polymethacrylate polyacrylate, and polyacetals, as well as glass can be used to form transparent hemispheres.

Other transparent polymers include transparent acrylonitrile-butadiene-styrene; transparent cellulose derivatives, in particular such cellulose esters, such as cellulose acetate, cellulose butyrate, cellulose propionate, cellulose triacetate and alkyl celluloses, such as ethyl cellulose; transparent allyl resins; transparent polyethers, in particular such chlorinated polyethers; transparent fluoroplastics; transparent melamines; transparent polyamides (nylon) transparent parylene polymers; transparent phenolics; transparent phenoxy resins; transparent polybutylene, transparent polycarbonates; transparent polyesters; transparent polyethylenes; transparent polypropylenes; transparent polyphenylenes; transparent polystyrenes, transparent polyurethanes; transparent polysulphones; transparent polyvinyl alcohols; transparent polyvinyl fluorides; transparent polyvinyl butyrals; transparent polyvinylidene chlorides, transparent silicones; transparent styrene acrylonitride; transparent styrene butadienes; transparent polyvinylchlorides; including transparent copolymers of any of these.

In the illustrated embodiment the mounting plate has a connecting aperture 28, which is in communication with both sides of the plate, therein maintaining the same inside pressure on both sides. The illustrated embodiment also has interface connections 60 in the wall of a hemisphere. Interface connections 60 permit electrical, hydraulic, and pneumatic communication to one or more other pressure vessels and other devices. Electrical interface connections 60b and fluid interface connections 60a are shown in both hemispheres. As will be discussed later, interface connections can also be made through the plate, if the thickness 26 of the plate permits. The illustrated mounting plate 20 also has an interior mounting element 25, for attaching internal components, such as electronic, mechanical, and electromechanical devices, to the interior of the plate.

The pressure vessel can be pressurized by creating a partial vacuum in the interior of the vessel. Pressurization is caused by the earth's atmosphere, which is at a higher pressure than the pressure exerted by the partial vacuum in the interior of the vessel. The ambient surface outside pressure less the inside pressure produces a force on the hemispheres, that causes a pre-crush of the hemispheres against the sealing elements on the intervening mounting plate. In the illustrated embodiment the pressure vessel has a vacuum port 12, by which a partial vacuum in the interior of the vessel is created. There are several advantages to creating a seal by using a vacuum. No hardware is needed to apply pressure to the hemispheres to generate the seal, and the pressure vessel is rapidly reconfigurable. The seal can be broken by allowing air or another gas such as nitrogen or helium into vacuum port 12, which in turn equalizes the inside pressure to the outside pressure. The seal can be reformed by again evacuating the interior of the vessel, so access to the interior is quick and reversible. Another advantage is the seal can be tested before subjecting the pressure vessel to high external pressures, such as underwater pressures. Another advantage is that the interior atmosphere can be comprised of any desired gas, where some gases would be more or less corrosive or oxidative, and have better heat transfer than air. A major advantage is that manufacturing the invented pressure vessel requires much less precision machining. The circular grooves on the first and second sides 24, 26 of the plate are not end pieces, and are much easier to machine than precision cut end pieces. The majority of pressure forces act in opposition by design, not by strength of material. Another advantage is that the symmetry of a transparent hemisphere allows its interior to be viewed from almost any angle without refractive distortion caused by the width of the wall, as almost all angles are perpendicular to the transparent hemisphere.

The plate 20 of the illustrated pressure vessel 10 has an exterior mounting element 14 for affixing the pressure vessel to a structure. The exterior mounting element 14 shown is a plurality of holes, where one is located in each corner of the mounting plate. The pressure vessel 10 can be attached to the structure having a similarly constructed plurality of complementary holes using connecting elements such as rivets; bolts and nuts, and the like. Other exterior mounting element systems are anticipated, such as trays, hooks, snaps, and locks.

Figure 3:
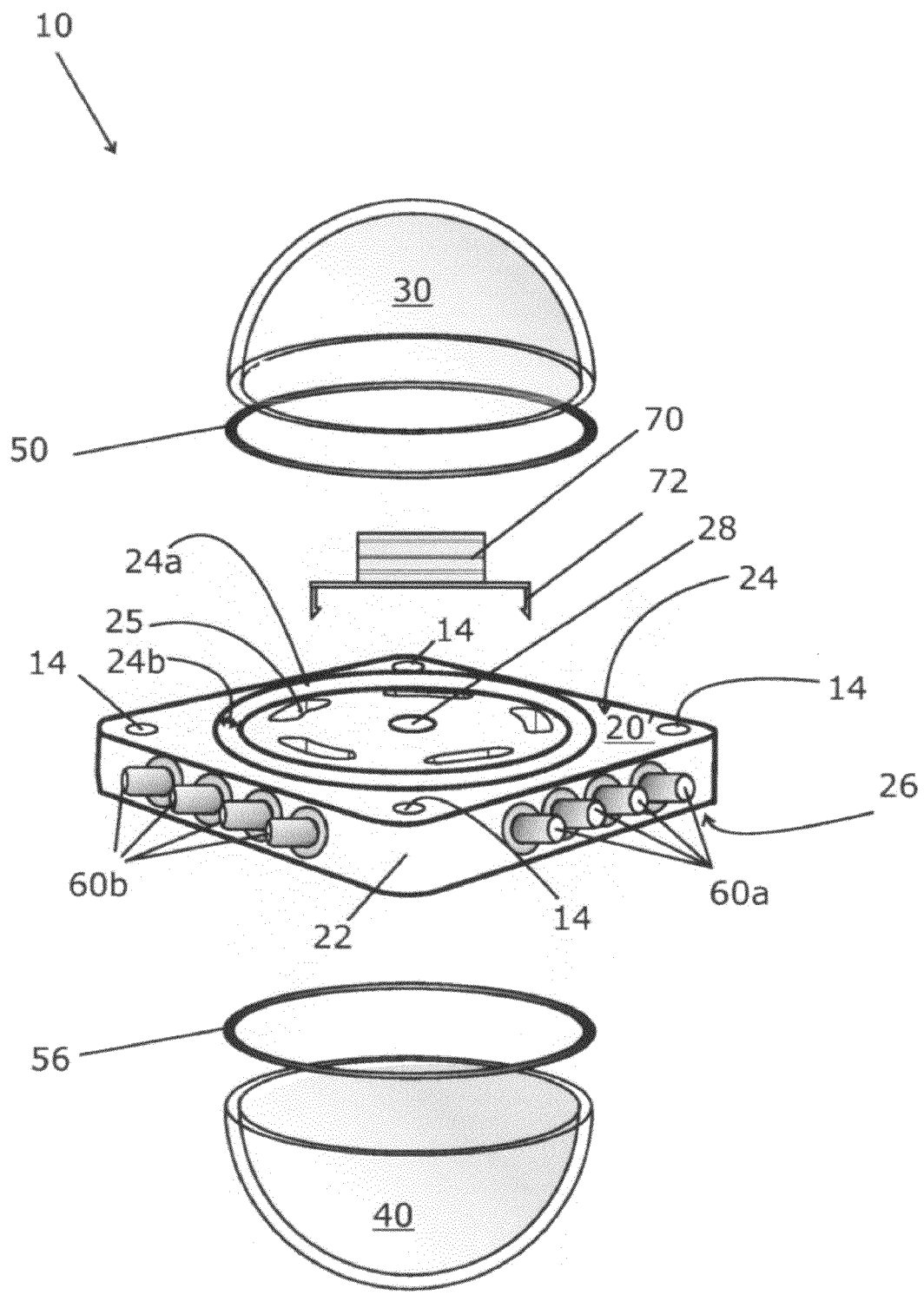
FIG. 3 is an exploded view of a pressure vessel that has a pair of hemispheres with a wall and a circular edge, a pair of sealing elements (including o-rings, gaskets, and the like) a thick intervening mounting plate with interface connections that enable communication with the interior.

Referring to FIG. 3, an alternate embodiment of the modular pressure vessel 10 is illustrated in an exploded view. The mounting plate 20' is much thicker, and the interface connections 60 are made through the plate 20'. Both fluid and electrical interface connectors 60a,60b are shown. The electromechanical device 70 is fitted to a fastening heat sink 72, and the heat sink 72 is aligned with the interior mounting element 25. The interior mounting element additionally is also a handhold for carrying the mounting plate and an opening for cable runs from one side of the plate to the other. The mounting plates (both 20 and 20') can be further machined to screw mount devices and hardware.

Figure 4:
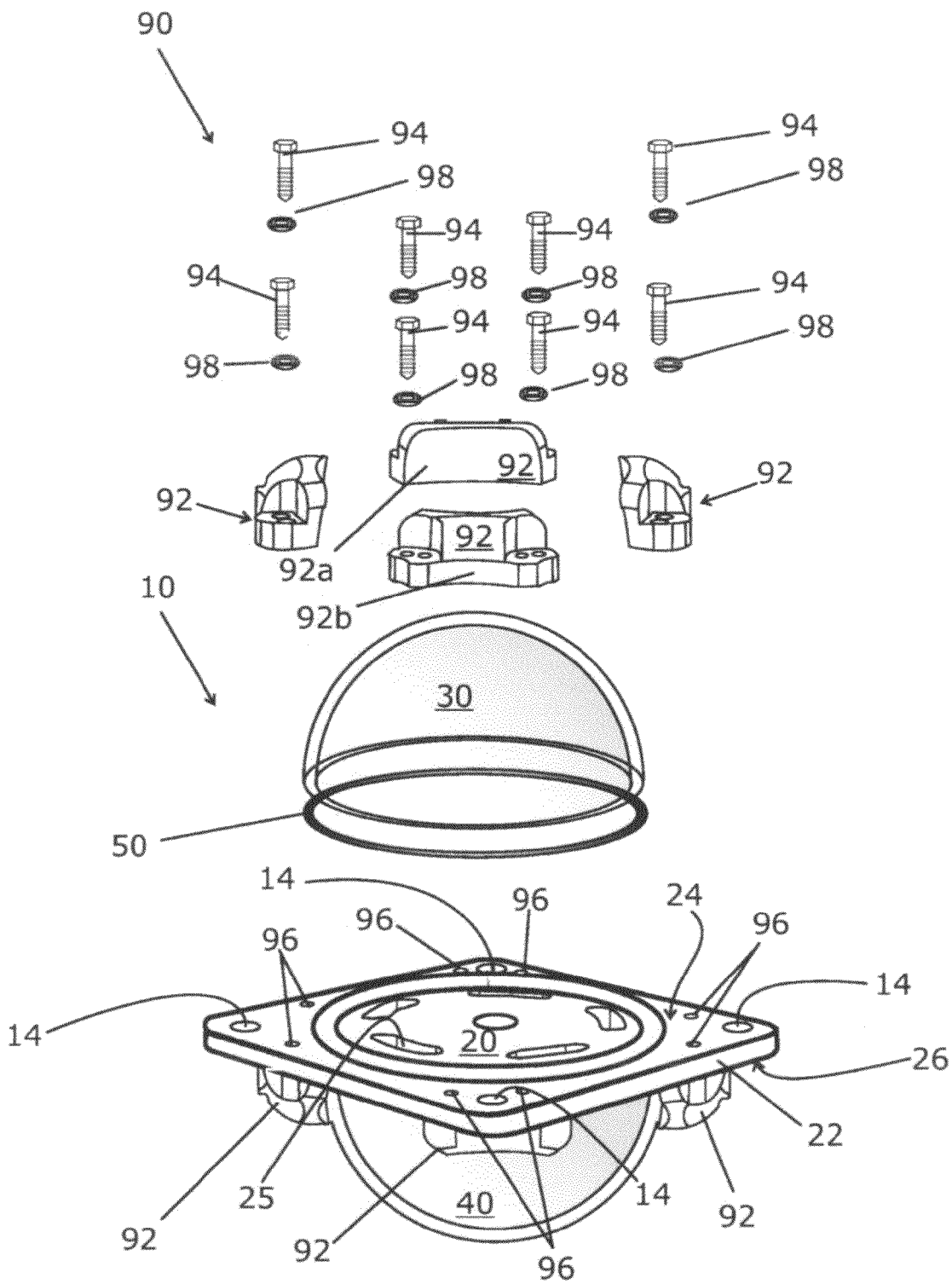
FIG. 4 is a partially exploded view of a pressure vessel that has a pair of hemispheres with a wall and a circular edge, a pair of sealing elements, an intervening mounting plate, and a set of hemisphere mounting clamps that press the transparent hemispheres against their respective sealing element providing a pre-crush.

Referring to FIG. 4, a variation of the pressure vessel is illustrated. The first hemisphere 30 is shown in an exploded view, while the second hemisphere 40 is shown fitted to the mounting plate 20. The electro-mechanical device 70 has been removed to better understand the illustrated embodiment. The variation employs a set of hemisphere mounting clamps 90 that press the hemispheres 30,40 against their respective sealing elements 50,56 providing a pre-crush. The pre-crush creates a seal without the need for a partial vacuum. The mounting clamps include a threaded element 94, a washer 98, a tapped hole element 96 of the mounting plate, and a clamping element 92 having a base portion 92a and a wall portion 92b. The threaded element 94 passes through clamping element 92 and is bolted to the tapped hole element 96 of the mounting plate, causing the base portion 92a to tighten around the hemisphere 30, 40 and pressing it against its respective sealing element 50,56. In the illustration there are 4 clamping elements per hemisphere. However, the exact number of clamping elements is not critical, and could be selected to have as few as two and at least as many clamping elements as there are corners of the mounting plate. The present plate has four corners. For instance, a hexagonal plate could have 6 clamping elements 92, as there are six corners. In the illustration, there are two threaded elements 94, two washers 98, and two tapped hole elements 96 for each clamping element 92. Both the first hemisphere 30 and the second hemisphere 40 are attached using a set of hemisphere mounting clamps 90.

It is anticipated that the hemispheres can be attached to the intervening plate 20 using a combination of one or more methods. For instance, the second hemisphere 40 could be attached using the set of hemisphere mounting clamps 90, and the first hemisphere 30 could be attached using a partial vacuum. Alternatively, a large C-clamp could be used to simultaneously attach both hemispheres 30,40. The mode of attachment disclosed in the invention has been found to be suitable for work at sea, where the working conditions are not always stable, but other means such as a large C-clamp or a vise could work well in a land based work environment. Additionally, the disclosed methods of attaching the hemispheres are substantially independent of the size of the pressure vessel, whereas other methods would require equipment and tools sized for the pressure vessel.

Figure 5:
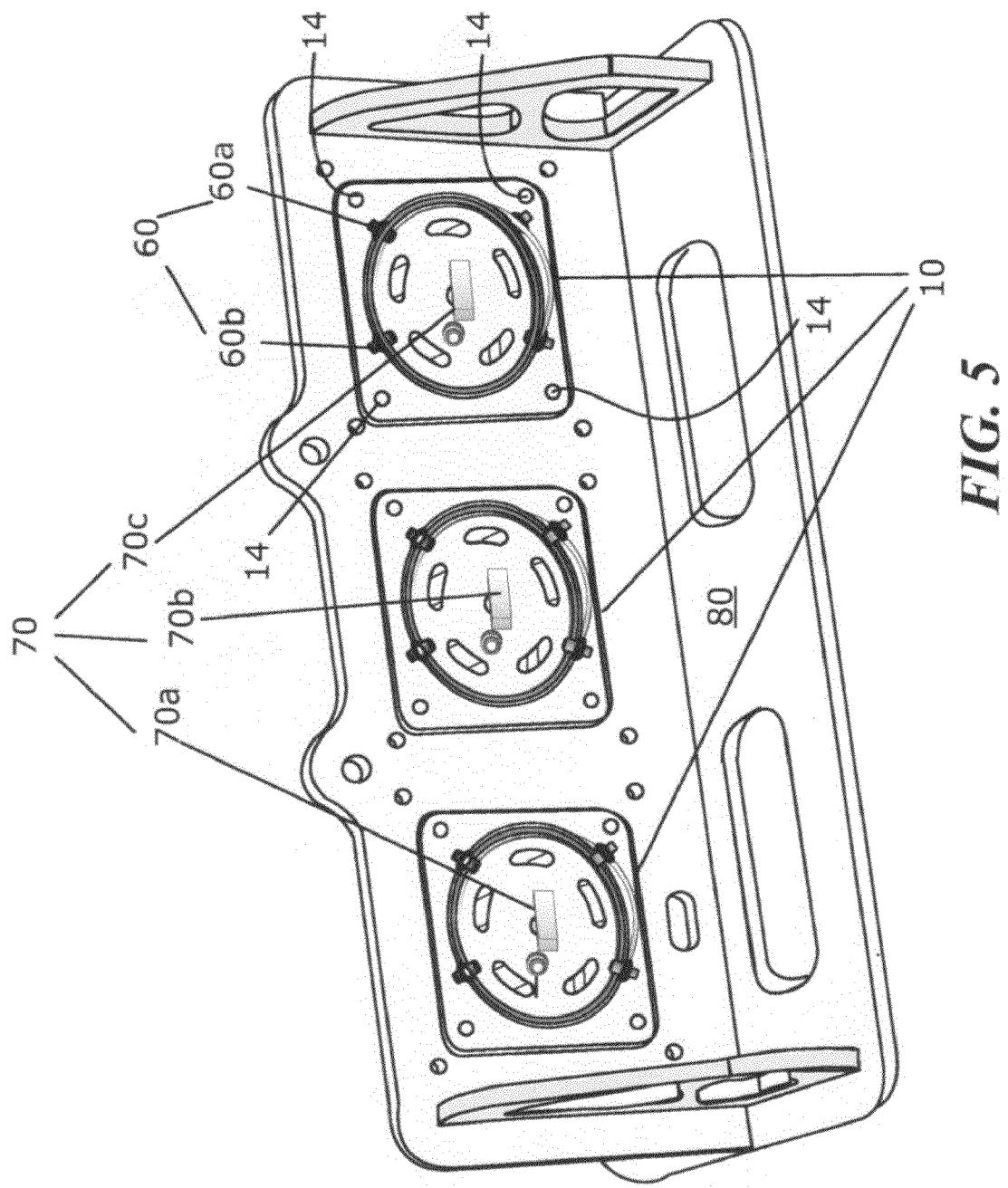
FIG. 5 is a perspective side view of modular pressure vessels ganged and mounted to a structure.

The modular pressure vessel can be used individually, ganged with other pressure vessels, and in combination with other devices. Referring to FIG. 5, which is a perspective side view of modular pressure vessels ganged and mounted to a structure 80, where two or more ganged modular pressure vessels 10 provide redundancy or different functions. The illustrated embodiment shows three pressure vessels, each housing an electromechanical device 70. The interface connections 60 are shown, but the actual wires and conduits are not illustrated. In the illustrated embodiment, three identical pressure vessels are mounted to the structure utilizing an exterior mounting element 14. There are four exterior mounting elements per pressure vessel 10. As an exemplary embodiment illustrated in FIG. 5, each electromechanical device 70 can be substantially the same, except that each has been programmed differently. Electromechanical device 70a, is a primary computer that runs calculations in parallel using electromechanical device 70b and electromechanical device 70c. Electromechanical device 70b has been programmed to take over primary control if electromechanical device 70a fails. The redundancy and sharing provides a higher level of confidence that there will be a working computer. The entire system is much more robust.

The pressure vessels are modular, differing only in what is housed in the interior. In the illustrated case, for example, the electromechanical devices are also the same, differing only in their program. The embodiment can be expanded by either making a structure that houses more pressure vessels or by combining structures 80. An array of structures fitted with modular pressure vessels can be formed to further expand the network.

It is to be understood that the foregoing description and specific embodiments are merely illustrative of the best mode of the invention and the principles thereof, and that various modifications and additions may be made to the invention by those skilled in the art, without departing from the spirit and scope of this invention, which is therefore understood to be limited only by the scope of the appended claims.

What is claimed is:

1. A pressure vessel, said pressure vessel comprising:
    a transparent first hemisphere with a first wall having a first outside diameter, a first inside diameter, and a first circular edge with a first width;
    a first gasket composed of an elastic polymeric material;
    a transparent second hemisphere with a second wall having a second outside diameter, a second inside diameter, and a second circular edge with a second width;
    a second gasket composed of an elastic polymeric material; and
    at least one interface connection disposed in one of said first wall and said second wall, said at least one interface connection selected from the group consisting of electrical, fluid and pneumatic interface connectors;
    at least one vacuum port disposed in one of said first wall and said second wall;
    a mounting plate with a thickness, said plate having a first side with a first circular groove with a breadth greater than the first width of the first circular edge, an opposing second side with a second circular groove with a breadth greater than the second width of the second circular edge, at least one aperture in communication with said first and second sides and disposed within the perimeters of said first and second circular grooves, and at least one mounting hole disposed outside the perimeters of said first and second circular grooves;
    an interior mounting element disposed on said mounting plate and adapted to affix an electromechanical device thereto;
    where the first gasket is seated between the first circular groove and the first circular edge of the first hemisphere forming a first seal, said first seal being formed by the first hemisphere pressing against the first sealing element; and the second gasket is seated between the second circular groove and the second circular edge of the second hemisphere forming a second seal, said second seal being formed by the second hemisphere pressing against the second sealing element;
    where a volume inside the first and second sealed hemispheres defines an interior of the pressure vessel having an inside pressure, and an exterior of the pressure vessel having an outside pressure; and
    wherein an increase in the outside pressure produces an increased pressure by the individual hemispheres on their respective sealing element, therein providing a tighter seal.

2. The pressure vessel according to claim 1, further comprising at least one electromechanical device removably attached to said interior mounting element, said at least one electromechanical device being in communication with said exterior of the pressure vessel through one of said interface connections.

3. The pressure vessel according to claim 1, wherein said first hemisphere, said second hemisphere, and said mounting plate are composed of polymeric materials.

* * * * *